United States Patent
Mehta et al.

[11] 4,016,062
[45] Apr. 5, 1977

[54] METHOD OF FORMING A SERRATED SURFACE TOPOGRAPHY

[75] Inventors: Rajendra Rangraj Mehta, Palo Alto; Otto Voegeli, San Jose, both of Calif.

[73] Assignee: International Business Machines Corporation, Armonk, N.Y.

[22] Filed: Sept. 11, 1975

[21] Appl. No.: 612,382

[52] U.S. Cl. .................. 204/192 E; 156/654; 219/121 EM; 428/167
[51] Int. Cl.² ............................ C23C 15/00
[58] Field of Search ........... 204/192; 219/121 EM, 219/121 EB; 156/6, 7, 8, 17, 18; 428/167

[56] References Cited
UNITED STATES PATENTS

| | | | |
|---|---|---|---|
| 3,860,783 | 1/1975 | Schmidt et al. | 219/121 EM |
| 3,904,462 | 9/1975 | Dimigen et al. | 156/13 |

OTHER PUBLICATIONS

H. L. Garvin, "High Resolution Fabrication by Ion Beam Sputtering," *Solid State Technology*, Nov. 1973, pp. 531–536.
P. G. Gloersen, "Ion Beam Etching," *J. Vac. Sci. Tech.*, vol. 12, No. 1, Jan., Feb. 1975, pp. 28–35.

*Primary Examiner*—John H. Mack
*Assistant Examiner*—Aaron Weisstuch
*Attorney, Agent, or Firm*—Joseph E. Kieninger

[57] ABSTRACT

A method of forming a serrated surface topography useful for the unidirectional propagation of magnetic domains is disclosed. The method includes the step of forming a substantially rectangular wave topograhy on the surface of the structure and subsequently ion milling the rectangular wave topography at an oblique angle of incidence to form the serrated surface topography.

9 Claims, 9 Drawing Figures

METHOD OF FORMING A SERRATED SURFACE TOPOGRAPHY

BACKGROUND OF THE INVENTION

1. Field of the Invention

This invention relates to surface topography and more particularly to a method for forming a serrated surface topography.

2. Description of the Prior Art

Bubble domains are propagated by (a) rotating field propagation systems having T and I bars or chevron permalloy overlay patterns (b) modulated bias field propagation systems having angel fish patterns etched in the bubble material or deposited as a permalloy film on top of the bubble material and (c) current loop propagation systems.

An alternate modulated bias field propagation system approach was proposed in the patent to Bobeck et al. U.S. Pat. No. 3,540,019. This propagation system utilizes a serrated surface topography as shown in FIG. 1. The serrated surface topography produces unidirectional bubble domain translation when the bias field is modulated. The serrated surface topography consists of a periodic pattern of serrate grooves running perpendicular to the direction of the bubble domain translation. It is the purpose of this serration to produce a unidirectional wall motion coercive force perpendicular to the grooves. A unidirectional coercive force for wall motion arises because the energy of the domain wall is proportional to its height, which equals the local film thickness. The sloped surface of the serration thus exerts a force on any domain wall located under such a sloped position, tending to move the wall toward the low point of the slope. The magnitude of this force is proportional to the surface slope and is largest for a wall segment oriented parallel to the serration direction. No force is exerted on a wall segment which is oriented perpendicular to the serration direction. It can be seen that a small force suffices to push a wall segment up the gentle slope 80, while a much larger force is required to push a wall segment up the steep slope 76 as shown in FIG. 1. On varying the bubble size by at least one serration period by means of a bias field modulation, the serration acts much like a ratchet on the bubble wall and thus propagates the bubble in the gently increasing slope direction. The term "unidirectional coercive force" is used to specify the difference in force required to move a bubble in the forward and the backward direction and describes the efficiency of the serration topography. The unidirectional coercive force is largest with a backward slope of 90° as shown in U.S. Pat. No. 3,540,019.

In a typical bubble material, such as Europium Yttrium Iron garnet, having a characteristic length, $l$, to thickness, $h$, ratio of 0.25, where $l$ and $h$ are two well known material parameters, the bubble size within a bubble lattice varies typically between $4\mu$ and $8\mu$ when the bias field is varied between $240e$ and $180e$. The $4\mu$ modulation in bubble size thus allows for a maximum serration period of $4\mu$. More reliable lattice propagation is obtained when the serration period is somewhat smaller than the modulation in bubble size.

When a serrate surface topography is used to propagate isolated bubble domains, the width of the serration needs to be substantially equal to the bubble domain diameter. If the serration pattern has a width of many bubble diameters, then additional means are required to guide the bubbles along the desired specific propagation paths. Such guide rails may consist of a pair of permalloy stripes deposited onto the bubble material, or alternately, they may consist of a pair of raised dams or both sides of the propagation path.

It has been found that a serrate surface topography can be used not only for the propagation of isolated bubbles, but also for the unidirectional propagation of bubble lattices in "bubble lattice devices" discussed in copending U.S. patent application Ser. No. 632,604 filed on Nov. 14, 1975 and assigned to the assignee of the present invention. When applied to bubble lattices relative bubble positions are defined by magnetostatic interactions among the bubbles within the lattice, so that guide rails, or lattic isolation means, are required only along both boundaries of the translatable information storing lattice. Use of a serrate surface topography not only eliminates the need for drive conductors, but also provides for uniformly distributed rather than localized driving forces.

While a serrated surface topography has been disclosed, no method of forming such a structure has been described in the literature. Conventional ion milling techniques employed either perpendicular to the surface or at an angle incident thereto do not in and of themselves yield the desired surface topography.

SUMMARY OF THE INVENTION

It is a primary object of this invention to provide a method of forming a serrated surface topography.

It is another object of this invention to provide a method of forming a surface topography suitable for the unidirectional translation of bubble domains in a lattice.

These and other objects of this invention are accomplished by a method in which a structure is formed having a substantially rectangular wave surface topography. This surface is then ion milled at an oblique angle of incidence to form a serrated surface topography. The angle of incidence used for the ion milling varies between 50° to 75° with the preferred angle being about 60°.

Other objects of this invention will be apparent from the following detailed description, reference being made to the accompanying drawings wherein various stages of the fabrication method are shown.

DESCRIPTION OF THE ILLUSTRATIVE EMBODIMENT

Figure 1:
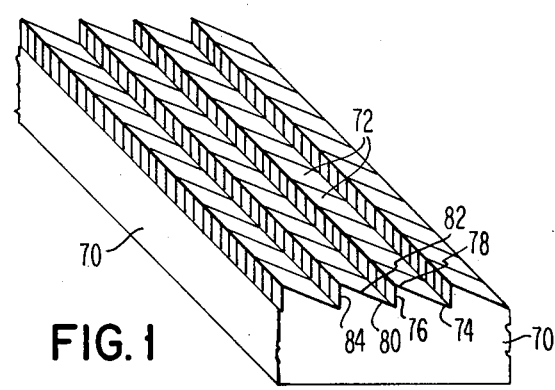
FIG. 1 is a view in perspective of a serrated surface topography formed in accordance with this invention.

As shown in FIG. 1 a film or layer 70 of bubble domain material has a serrated surface topography 72 on the top surface thereof. The serrated surface topography 72 consists of a forward slope 74 and a backward slope 76 which meet at point 78. Unidirectional translation occurs when the bias field normal to the film plane is modulated. For example, a bubble domain in film 70 would be propagated in the direction from the forward slope 74 to the forward slope 80. As the magnetic field is reduced, the domain will expand in size in the direction previously stated with the leading wall segment moving over point 82 and beyond backward slope 84. As the magnetic field is increased the domain will contract. The contraction of the leading wall segment is limited by the backward slope 84 which acts as a barrier to wall movement in that direction. The trailing wall segment however moves up the forward slope 74 over point 78 onto the backward slope 80. Unidirectional motion is provided by this pulling and pushing effect which is accomplished by modulating or oscillating the magnetic bias field.

Figure 2:
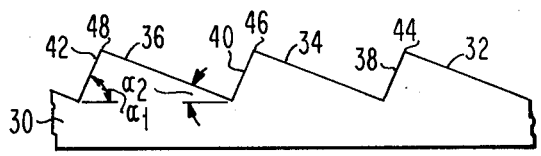
FIGS. 2 and 3 are crossectional views of a serrated surface topography formed in accordance with this invention.

Another embodiment of magnetic material having a serrated surface topography is shown in FIG. 2. A film 30 has forward slopes 32, 34 and 36, respectively, which meet backward slopes 38, 40 and 42 at points 44, 46 and 48, respectively. The angle of the backward slopes if given by $\alpha_1$ and the angle of the forward slopes is given by $\alpha_2$. The backward slope angle $\alpha_1$ is preferably 90° for maximum effect as a barrier. The unidirectional coercive force for the serrated structure is proportional to the difference in the slopes $\alpha_1 - \alpha_2$.

Figure 3:
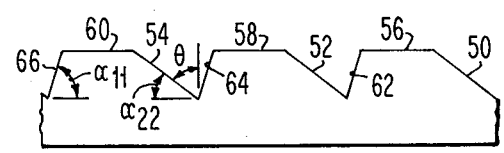

Another embodiment of a serrated surface topography structure formed in accordance with the method of this invention is shown in FIG. 3. In this embodiment the forward slopes 50, 52 and 54 are connected to a horizontal area 56, 58 and 60 respectively, which in turn are connected to backward slopes 62, 64 and 66 respectively. The backward slope has an angle $\alpha_{11}$. The forward slope has an angle $\alpha_{22}$ as shown.

Figure 4A:
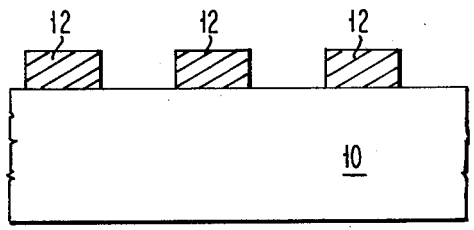
FIGS. 4A–4F are crossectional views of the structure featuring the steps of the method in this invention.
Figure 4B:
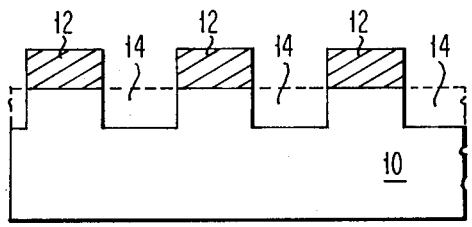
Figure 4C:
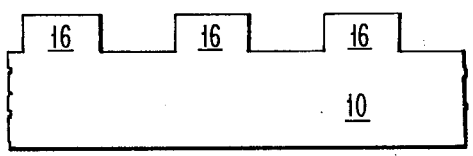

The structures shown in FIGS. 1, 2 and 3 are the type of serrated surface topography structures formed in accordance with this invention. FIG. 4 illustrates the steps of this method used to form the structure shown in FIG. 3. In FIG. 4A a layer 10 of a material capable of supporting bubble domains therein is provided with a layer of photoresist on the surface thereof and a rectangular wave photoresist pattern 12 is formed in the conventional manner well known in the industry. The layer 10 is then treated to remove portions 14 not masked by the photoresist pattern 12 as shown in FIG. 4B. The portions 14 may be removed by chemical or sputter etching or it may be removed by ion milling normal to the layer. The resultant structure is shown in FIG. 4C in which the layer 10 has raised portions 16 which form a rectangular wave surface topography. The raised portions 16 may vary in height and in width. The space between the raised portion 16 may also vary in length.

Figure 4D:
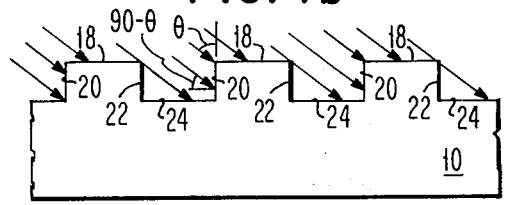
Figure 4E:
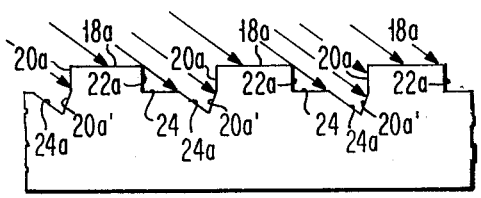

The rectangular wave surface topography shown in FIG. 4E may also be formed by depositing on the surface.

An example of the dimensions of the raised portions 16 are of the order of 1 or 2 microns in width and 0.5 to 1 microns in height. The space between the raised portions 16 may also be of the order of 1 or 2 microns. It is recognized that the height, width and spacing of the raised portion 16 may be varied substantially and this invention is not limited to the dimensions given as examples.

As shown in FIG. 4D the rectangular wave surface topography of layer 10 is ion bombarded at an oblique angle of incidence to the horizontal surface perpendicular to the rectangular wave direction. The ion beam bombards the rectangular wave tops 18, the rectangular wave sides 20 and later, as shown in FIG. 4E, the rectangular wave bottoms 24.

In general, in surfaces having a serrated topography, bubble domain propagation is most efficient, when the unidirectional coercivity is maximum. Such is the case with a surface topography as is shown in FIG. 1, with the serration wavelength given such as not to exceed the induced modulation of bubble diameter. With a suitable angle of ion milling and a correspondingly suitable initial rectangular wave surface topography, the described fabrication method yields a topography as is shown in FIG. 2, which closely approximates the ideal structure shown in FIG. 1.

To obtain maximum unidirectional coercivity, the slope ratio $\alpha_1/\alpha_2$ (see FIG. 2) needs to be maximum. This is achieved when the ion milling rate of the rectangular wave top 18 and bottom 24 is large compared to the milling rate of the rectangular wave side 20.

It is well know that these ion milling rates vary with the angle of incidence, $\theta$. The angle of incidence, $\theta$, being measured from the vertical axis. It has been determined that the top to side milling rate ratio is largest when the angle of incidence, $\theta$, is between 55° and 75° and preferably about 60°. When the top 18 and bottom 24 are milled at 60° angle of incidence, the vertical side 20, in effect, is milled at a 30° angle of incidence, i.e., (90°−$\theta$). The optimum angle of incidence depends somewhat on the material to be milled as well as on the energy of ion milling. The depth of ion milling required has to be no smaller than the rectangular wave height 22, otherwise a vertical slope 22a is left in addition to the forward slope 24a and a vertical slope 20a is left in addition to the backward slope 20a' as is shown in FIG. 4E.

Figure 4F:
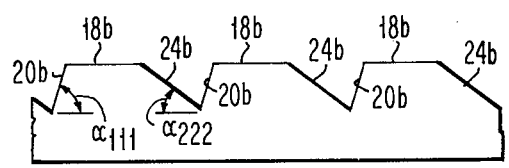

The milling is continued until portion 16 has been completely removed to yield the structure shown in FIG. 4F or as in the preferred embodiments of FIGS. 1 or 2. The resultant serrated surface topography in FIG. 4F has a backward slope 20b leading to top 18b which leads to the forward slope 24b which in turn is connected to the next back slope 20b etc. The back slopes 20b form an angle with the horizontal at its bases of $\alpha_{111}$. The forward slopes 24 form an angle with the horizontal at its base of $\alpha_{222}$. The backward slopes may have values between 90° and 45° and the forward slopes may have values between 5° and 45°.

In order to obtain a maximum slope ratio $\alpha_1/\alpha_2$, rectangular wave dimensions are chosen such that the ratio between wave bottom 24 to wave height 22 equals tan $\theta$, where $\theta$ is the angle of incidence of ion milling [i.e., tan $\theta$=[24 ]/[22]]. The preferred ratio is about 2. It is desirable that the wave top dimension 18 be smaller than the wave bottom dimension 24, otherwise the resulting surface topography has a structure as is shown in FIG. 4f, which because of the remaining flat top 18b, has a smaller slope ratio $\alpha_{111}/\alpha_{222}$ that the structure of FIG. 2 having a smaller angle $\alpha_2$. The best structure, as is shown in FIG. 2 is obtained when the dimensions shown in FIG. 4D satisfy the following relationship:

$$\frac{[24]}{[18]} = \tan\theta \, \frac{R(\theta)}{R(90° - \theta)} = 4,$$

where $R(\theta)$ is the rate of ion milling at an angle of incidence $\theta$.

Flat tops or bottoms arise when the rectangular wave dimensions are not correctly chosen for a particular milling angle with the corresponding horizontal/vertical milling rate ratio. Flat tops or bottoms are areas of zero unidirectional coercive force and thus reduce, for a given serration period, the resulting unidirectional coercive force below optimum.

EXAMPLE 1

An LPE film Europium Yttrium Iron garnet approximately 4.0 microns thick was deposited on a gadolinium gallium garnet substrate. A photoresist film 1.8 microns thick was applied on top of the LPE film. Using an emulsion mask a line and space pattern was formed by exposing and having 1 micron line separated by 1 micron spaces. The photoresist pattern left on the LPE film is shown in FIG. 4A.

Ion milling was employed with ions striking normal to the surface to remove 0.36 microns of the LPE film. The resultant structure is shown in FIG. 4B. The resist was removed and a rectangular wave pattern was left on the LPE pattern as shown in FIG. 4C. The rectangular wave structure was then subjected to ion milling with an angle of incidence at 55° from the vertical axis as shown in FIG. 4D. The ion milling was continued to remove 0.38 microns of the LPE film to form the structure shown in FIG. 4F.

Unidirectional translation of isolated domains as well as bubble domain lattices have been observed in this sample over a wide range of operating conditions. A bias field modulation of about 10% of the bubble collapse field appears sufficient to produce a translation of one serration wavelength per modulation cycle.

Examples 2 through 5 are set forth in the following tables. The process steps were similar to those described in Example 1 with the parameters being set forth in the table.

| Example No. | Pattern line width | Pattern Spacing width | Ion Milling Angle of Incidence | Ion Milling Energy | Film Removed, $\mu$ |
|---|---|---|---|---|---|
| 2 | 1$\mu$m | 2$\mu$m | 55° | 500e | .38 |
| 3 | 2$\mu$m | 1$\mu$m | 55° | 500e | .38 |
| 4 | 2$\mu$m | 2$\mu$m | 55° | 500e | .38 |
| 5 | 1$\mu$m | 1$\mu$m | 70° | 750e | .32 |

The translation of bubbles in Example 5 were compared with Example 1. The results indicated that the translation of bubbles in Example 1 was more effective than Example 5 because the backward slope angle of Example 1 was greater than for Example 5.

This method of forming a serrated surface topography includes forming a structure having a single forward slope and/or a single backward slope in specific locations. For example, this method can be used to form a forward slope leading from a layer having a thickness $h$ suitable to support isolated bubbles at a given bias field to a thicker layer which supports a densely packed bubble lattice at the same bias field.

Although several preferred embodiments of this invention have been described, it is understood that numerous variations may be made in accordance with the principles of this invention.

I claim:

1. A method of forming a serrated surface topography comprising the steps of
   forming a structure having a substantially rectangular wave surface topography,
   ion milling said rectangular wave surface topography at an oblique angle of incidence to form a serrated surface topography.

2. A method as described in claim 1 whereby the angle of incidence formed with the perpendicular to the surface topography is about 50° to 75°.

3. A method as described in claim 2 whereby the angle of incidence is about 60°.

4. A method as described in claim 1 whereby the rectangular wave surface topography is formed by etching the surface.

5. A method as described in claim 1 whereby the rectangular wave surface topography is formed by ion milling the surface.

6. A method as described in claim 1 whereby the rectangular wave surface topography is formed by depositing material on the surface.

7. A method as described in claim 1 whereby a single slope is formed.

8. A method of forming a serrated surface topography having a larger backward slope and a smaller forward slope comprising the steps of
   forming a structure having a substantially rectangular wave surface topography,
   ion milling said rectangular wave surface topography at an oblique angle of incidence to form a serrated surface topography having a backward slope of 90° to 45°.

9. A method as described in claim 8 whereby the ion milling step is performed to yield a forward slope of 5° to 45°.

* * * * *